US009768684B1

(12) United States Patent
Banerjee et al.

(10) Patent No.: US 9,768,684 B1
(45) Date of Patent: Sep. 19, 2017

(54) DIFFERENTIAL CHARGE PUMP WITH EXTENDED OUTPUT CONTROL VOLTAGE RANGE

(71) Applicant: QUALCOMM Incorporated, San Diego, CA (US)

(72) Inventors: Anirban Banerjee, Cary, NC (US); Todd Morgan Rasmus, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/334,958

(22) Filed: Oct. 26, 2016

(51) Int. Cl.
*H03L 7/06* (2006.01)
*H02M 3/07* (2006.01)
*H03L 7/099* (2006.01)
*H03L 7/089* (2006.01)
*H03L 7/093* (2006.01)

(52) U.S. Cl.
CPC ............ *H02M 3/07* (2013.01); *H03L 7/0891* (2013.01); *H03L 7/093* (2013.01); *H03L 7/099* (2013.01)

(58) Field of Classification Search
CPC ....... H03L 7/0895; H03L 7/0896; H03L 7/18; H03L 7/0891; H03L 7/0893
USPC .......................................................... 327/157
See application file for complete search history.

(56) References Cited

U.S. PATENT DOCUMENTS

| 6,469,554 | B1 | 10/2002 | Harpham | |
|---|---|---|---|---|
| 6,980,046 | B2 | 12/2005 | Soe | |
| 7,492,197 | B2 | 2/2009 | Lin et al. | |
| 7,701,270 | B2 | 4/2010 | Wyatt et al. | |
| 7,977,984 | B1* | 7/2011 | D'Souza | H03L 7/0807 327/148 |
| 8,183,913 | B2* | 5/2012 | Swei | H03L 7/0895 327/148 |
| 8,542,055 | B2 | 9/2013 | Snowdon | |
| 2007/0176655 | A1* | 8/2007 | Dvorak | H03L 7/0896 327/157 |

OTHER PUBLICATIONS

Cheng, Shanfeng et al.; Design and Analysis of an Ultrahigh-Speed Glitch-Free Fully Differential Charge Pump With Minimum Output Current Variation and Accurate Matching; IEEE Transactions on Circuts and Systems—II: Express Briefs, vol. 53, No. 9, Sep. 2006; pp. 843-847.
Palermo, Sam; Analog & Mixed-Signal Center, Texas A&M University; Lecture 8: Charge Pump Circuits; ECEN620: Network Theory Broadband Circuit Design; Fall 2014; pp. 1-18.

* cited by examiner

*Primary Examiner* — Quan Tra
(74) *Attorney, Agent, or Firm* — Loza & Loza, LLP/Qualcomm

(57) ABSTRACT

One aspect of the present disclosure relates to a method for operating a charge pump. The method includes comparing a drain voltage of a current sink transistor of the charge pump with a drain voltage of a current reference transistor, and adjusting a gate bias voltage of the current sink transistor and the current reference transistor in a direction that reduces a difference between the drain voltage of the current sink transistor and the drain voltage of the current reference transistor. The method also includes comparing a common-mode voltage of a loop filter with a reference voltage, and adjusting a gate bias voltage of a current source transistor of the charge pump in a direction that reduces a difference between the common-mode voltage of the loop filter and the reference voltage.

20 Claims, 13 Drawing Sheets

US 9,768,684 B1

DIFFERENTIAL CHARGE PUMP WITH EXTENDED OUTPUT CONTROL VOLTAGE RANGE

BACKGROUND

Field

Aspects of the present disclosure relate generally to charge pumps, and more particularly, to charge pumps with extended output control voltage ranges.

Background

Charge pumps are commonly used in phase locked loops (PLLs). Typically, a charge pump receives up/down signals from a phase frequency detector (PFD) based on detected phase differences (errors) between a reference signal and a feedback signal. The charge pump charges/discharges a loop filter based on the received up/down signals to produce an output control voltage for a voltage-controlled oscillator (VCO).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a system is provided. The system includes a first feedback circuit and a second feedback circuit. The first feedback circuit is configured to compare a drain voltage of a current sink transistor of a charge pump with a drain voltage of a current reference transistor, and to adjust a gate bias voltage of the current sink transistor and the current reference transistor in a direction that reduces a difference between the drain voltage of the current sink transistor and the drain voltage of the current reference transistor. The second feedback circuit is configured to compare a common-mode voltage of a loop filter with a reference voltage, and to adjust a gate bias voltage of a current source transistor of the charge pump in a direction that reduces a difference between the common-mode voltage of the loop filter and the reference voltage.

A second aspect relates to a system. The system includes a first error amplifier having a first input, a second input coupled to a drain of a current reference transistor, and an output coupled to a gate of the current reference transistor, a gate of a first current sink transistor of a charge pump, and a gate of a second current sink transistor of the charge pump. The system also includes a first transmission gate coupled between a drain of the first current sink transistor and the first input of the first error amplifier, and a second transmission gate coupled between a drain of the second current sink transistor and the first input of the first error amplifier. The system further includes a control circuit configured to sense a polarity of a voltage across a loop filter, to turn on the first transmission gate if the sensed polarity of the voltage is positive, and to turn on the second transmission gate if the sensed polarity of the voltage is negative.

A third aspect relates to a method for operating a charge pump. The method includes comparing a drain voltage of a current sink transistor of the charge pump with a drain voltage of a current reference transistor, and adjusting a gate bias voltage of the current sink transistor and the current reference transistor in a direction that reduces a difference between the drain voltage of the current sink transistor and the drain voltage of the current reference transistor. The method also includes comparing a common-mode voltage of a loop filter with a reference voltage, and adjusting a gate bias voltage of a current source transistor of the charge pump in a direction that reduces a difference between the common-mode voltage of the loop filter and the reference voltage.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
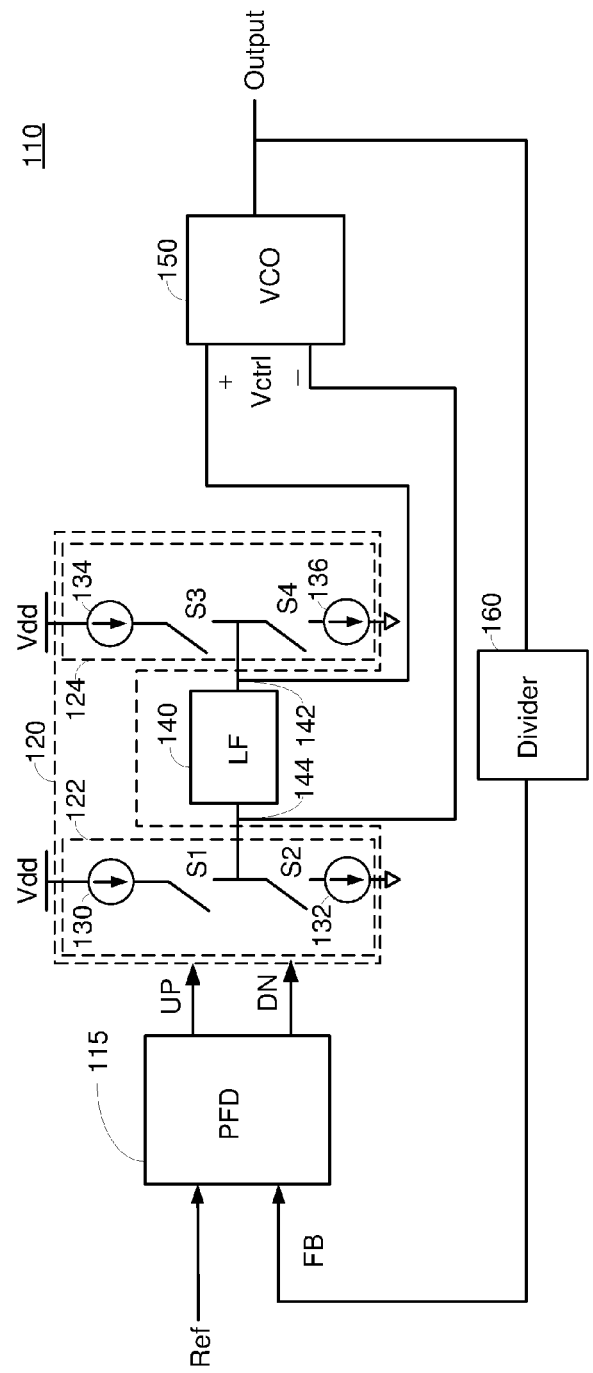
FIG. 1 shows an exemplary phase locked loop (PLL).

Phase locked loops (PLLs) are commonly used in communication systems. For example, a PLL may be used in a communication system to generate a signal with a desired frequency from a reference signal with a fixed frequency. FIG. 1 shows an example of a PLL 110 according to certain aspects. The PLL 110 includes a phase frequency detector (PFD) 115, a differential charge pump 120, a loop filter 140, a voltage-controlled oscillator (VCO) 150, and a frequency divider 160.

In operation, the VCO 150 generates the output signal of the PLL 110, in which the frequency of the output signal is controlled by a control voltage Vctrl input to the VCO 150. The frequency divider 160 divides the frequency of the output signal by a divider value N to produce a feedback signal FB, which is fed to a first input of the PFD 115. A second input of the PFD 115 receives a reference signal Ref from an oscillator or another source.

The PFD 115 detects a phase difference (error) between a rising edge of the reference signal Ref and a rising edge of the feedback signal FB, and outputs an up signal (denoted "UP") or a down signal (denoted "DN") to the charge pump 120 based on the detected phase difference. Hereinafter, the up signal is referred to as the UP signal and the down signal is referred to as the DN signal. If the rising edge of the reference signal Ref leads the rising edge of the feedback signal FB, then the PFD 115 outputs an UP signal having a pulse width that is proportional to the detected phase difference. If the rising edge of the reference signal Ref lags the rising edge of the feedback signal FB, then the PFD 115 outputs a DN signal having a pulse width that is proportional to the detected phase difference. The charge pump 120 charges/discharges the loop filter 140 based on UP/DN signals from the PFD 115, as discussed further below.

The differential charge pump 120 includes a first branch 122 and a second branch 124. The first branch 122 includes a first current source device 130, a first switch S1, a second switch S2, and a first current sink device 132. The second branch 124 includes a second current source device 134, a third switch S3, a fourth switch S4, and a second current sink device 136. The loop filter 140 has a first terminal 142 coupled between the third and fourth switches S3 and S4 of the second branch 124, and a second terminal 144 coupled between the first and second switches S1 and S2 of the first branch 122. The first and second current source devices 130 and 134 set the current level for current sourced to the loop filter 140, and the first and second current sink devices 132 and 136 set the current level for current drawn from the loop filter 140, as discussed further below. The voltage across the loop filter 140 provides the control voltage Vctrl to the VCO 150.

In operation, when the charge pump 120 receives an UP signal from the PFD 115, the second and third switches S2 and S3 turn on (close) for the duration of the UP signal. As a result, current flows from the second current source device 134 to terminal 142 of the loop filter 140 and current flows from terminal 144 of the loop filter 140 to the first current sink device 132. This increases the control voltage Vctrl across the loop filter 140. When the charge pump 120 receives a DN signal from the PFD 115, the first and fourth switches S1 and S4 turn on (close) for the duration of the DN signal. As a result, current flows from the first current source device 130 to terminal 144 of the loop filter 140 and current flows from terminal 142 of the loop filter 140 to the second current sink device 136. This decreases the control voltage Vctrl across the loop filter 140.

The PFD 115, the charge pump 120, the loop filter 140, the VCO 150, and the frequency divider 160 are coupled in a negative feedback loop that adjusts the control Vctrl to the VCO 150 is a direction that reduces the phase error between the reference signal Ref and the FB signal. When the PLL 115 is locked, this causes the frequency of the output signal of the PLL 115 to be approximately equal to the frequency of the reference signal Ref multiplied by the divider value N of the frequency divider 160.

Figure 2:
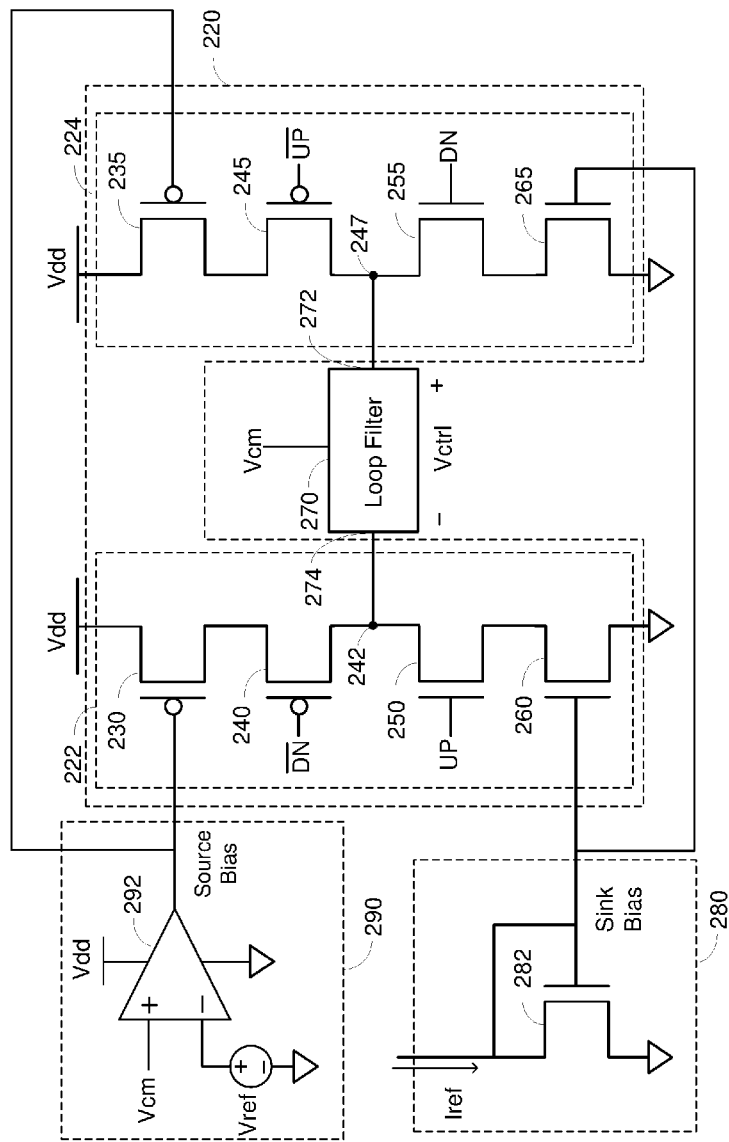
FIG. 2 shows an example of a differential charge pump according to certain aspects of the present disclosure.

FIG. 2 shows an exemplary differential charge pump 220 and an exemplary loop filter 270 coupled between the differential outputs of the charge pump 220 according to certain aspects. The differential charge pump 220 and the loop filter 270 may be used to implement the differential charge pump 120 and the loop filter 140 shown in FIG. 1. The voltage across the loop filter 270 provides the control voltage Vctrl to the VCO 150.

The differential charge pump 220 includes a first branch 222 and a second branch 224. The first branch 222 includes a first current source transistor 230 (e.g., p-type field effect transistor (PFET)), a first switch transistor 240 (e.g., PFET), a second switch transistor 250 (e.g., n-type field effect transistor (NFET)), and a first current sink transistor 260 (e.g., NFET). The first current source transistor 230 and the first switch transistor 240 are coupled in series between the supply rail Vdd and output node 242, and the second switch transistor 250 and the first current sink transistor 260 are coupled in series between output node 242 and ground.

The second branch 224 includes a second current source transistor 235 (e.g., PFET), a third switch transistor 245 (e.g., PFET), a fourth switch transistor 255 (e.g., NFET), and a second current sink transistor 265 (e.g., NFET). The second current source transistor 235 and the third switch transistor 245 are coupled in series between the supply rail and output node 247, and the fourth switch transistor 255 and the second current sink transistor 265 are coupled in series between output node 247 and ground. The loop filter 270 has a first terminal 272 coupled to output node 247, and a second terminal 274 coupled to output node 242.

The switch transistors 240, 245, 250 and 255 are configured to control the conduction path of the charge pump 220 according to UP and DN signals from the PDF 115, as discussed further below. The first and second current source transistors 230 and 235 are configured to source current to the loop filter 270, and the first and second current sink transistors 260 and 265 are configured to draw (sink) current from the loop filter 270, as discussed further below.

In the example in FIG. 2, the gate of the second switch transistor 250 is configured to receive an UP signal from the PFD 115, and the gate of the third switch transistor 245 is configured to receive the inverse of the UP signal (which may be generated by passing the UP signal through an inverter). Since the second switch transistor 250 is implemented with an NFET and the third switch transistor 245 is implemented with a PFET in this example, the second switch transistor 250 and the third switch transistor 245 turn on (close) in response to an UP signal (assuming the UP signal has a logic value of one). As a result, the charge pump 220 has the conduction path indicated by the arrows shown in FIG. 3A in response to the UP signal. In this case, the second current source transistor 235 sources current to terminal 272 of the loop filter 270, and the first sink transistor 260 draws (sinks) current from terminal 274 of the loop filter 270, which increases the control voltage Vctrl.

The gate of the fourth switch transistor 255 is configured to receive an DN signal from the PFD 115, and the gate of the first switch transistor 240 is configured to receive the inverse of the DN signal (which may be generated by passing the DN signal through an inverter). Since the first switch transistor 240 is implemented with a PFET and the fourth switch transistor 255 is implemented with an NFET in this example, the first switch transistor 240 and the fourth switch transistor 255 turn on (close) in response to a DN signal from the PFD 115 (assuming the DN signal has a logic value of one). As a result, the charge pump 220 has the conduction path indicated by the arrows shown in FIG. 3B in response to the DN signal. In this case, the first current source transistor 230 sources current to terminal 274 of the loop filter 270, and the second sink transistor 265 draws (sinks) current from terminal 272 of the loop filter 270, which decreases the control voltage Vctrl.

In the above discussion, it is assumed that the gate of the second switch transistor 250 is at logic zero when an UP signal is not present, and that the gate of the fourth switch transistor 255 is at logic zero when a DN signal is not present. It is also assumed that the gate of the first switch transistor 240 is at logic one when a DN signal is not present, and that the gate of the third switch transistor 245 is at logic one when an UP signal is not present. A logic one may correspond to a voltage approximately equal to the supply voltage Vdd.

Referring back to FIG. 2, the gates of the first and second current sink transistors 260 and 265 are biased by a current mirror 280. The current mirror 280 includes a current reference transistor 282, in which the drain and the gate of the current reference transistor 282 are tied together, and the gate of the current reference transistor 282 is coupled to the gates of the first and second current sink transistors 260 and 265. The current reference transistor 282 receives a reference current (denoted "Iref") from a current source (not shown), and generates a gate bias voltage (denoted "Sink Bias") for the first and second current sink transistors 260 and 265 based on the reference current. For example, if the current reference transistor 282 and the first and second current sink transistors 260 and 265 have approximately the same dimensions, then the current mirror 280 biases the gates of the first and second current sink transistors 260 and 265 so that the sink current of the charge pump 220 is approximately equal to the reference current Iref. The purpose of the current mirror 280 is to provide a relatively constant sink current for the charge pump 220 that is set by the reference current Iref. However, as will be explained further below, the current mirror 280 is unable to maintain a constant sink current over the entire range of the control voltage Vctrl.

The gates of the first and second current source transistors 230 and 235 are biased by a common-mode feedback circuit 290. The common-mode feedback circuit 290 includes an error amplifier 292 having a first input coupled to a common-mode feedback voltage (denoted "Vcm") of the loop filter 270, a second input coupled to a reference voltage (denoted "Vref"), and an output coupled to the gates of the first and second current source transistors 230 and 235. The reference voltage Vref may be provided by a voltage divider, and may be set to a voltage level approximately equal to half the supply voltage Vdd of the charge pump 220.

In operation, the error amplifier 292 compares the common-mode voltage Vcm with the reference voltage Vref, and adjusts the gate bias voltage (denoted "Source Bias") of the first and second current source transistors 230 and 235 in a direction that reduces the difference (error) between the reference voltage Vref and the common-mode voltage Vcm of the loop filter 270. In other words, the error amplifier 292 adjusts the gate bias voltage of the first and second current source transistors 230 and 235 to hold the common-mode voltage Vcm of the loop filter 270 at a voltage level approximately equal to Vref, which may be approximately equal to ½ Vdd to center the common-mode voltage Vcm. This negative feedback causes the source current of the charge pump 220 to have approximately the same magnitude as the sink current of the charge pump 220 since the source current and sink current need to be approximately equal in order to hold the common-mode Vcm of the loop filter 270 approximately constant at Vref.

Thus, the current mirror 280 sets the magnitude of the sink current based on the reference current Iref, and the common-mode feedback circuit 290 controls the gate bias voltage of the first and second source transistors 230 and 235 so that the source current has approximately the same magnitude as the sink current.

A drawback of the charge pump 220 shown in FIG. 2 is that the charge pump 220 is unable to maintain a constant current over the entire range of the control voltage Vctrl. As the magnitude of the control voltage Vctrl becomes large (e.g., approaches the supply rails of the charge pump 220), the drain-to-source voltage Vds across one of the sink transistors 260 and 265 becomes small (compressed), which pushes the sink transistor deep into the triode region. This causes the current magnitude and output impedance of the charge pump 220 to significantly drop. The large drop in the current magnitude and output impedance adversely impact the damping and stability of the PLL loop.

Embodiments of the present disclosure provide a feedback circuit that allows the charge pump 220 to maintain an approximately constant current magnitude over a larger (extended) control voltage Vctrl range. To do this, the feedback circuit compares the drain voltage of one of the sink transistors 260 or 265 with the drain voltage of the current reference transistor 282, and adjusts the gate bias voltage of the sink transistors in a direction that reduces the difference (error) between the drain voltage of the one of the sink transistors and the current reference transistor. This feedback causes the sink current to more closely match the reference current Iref even as one of the sink transistors is pushed into the triode region. As a result, the charge pump 220 is able to maintain an approximately constant sink current over an extended control voltage Vctrl range. This also maintains a high output impedance for the charge pump 220 over the extended control voltage Vctrl range. The high output impedance provides damping for the PLL loop, which reduces jitter.

Figure 4:
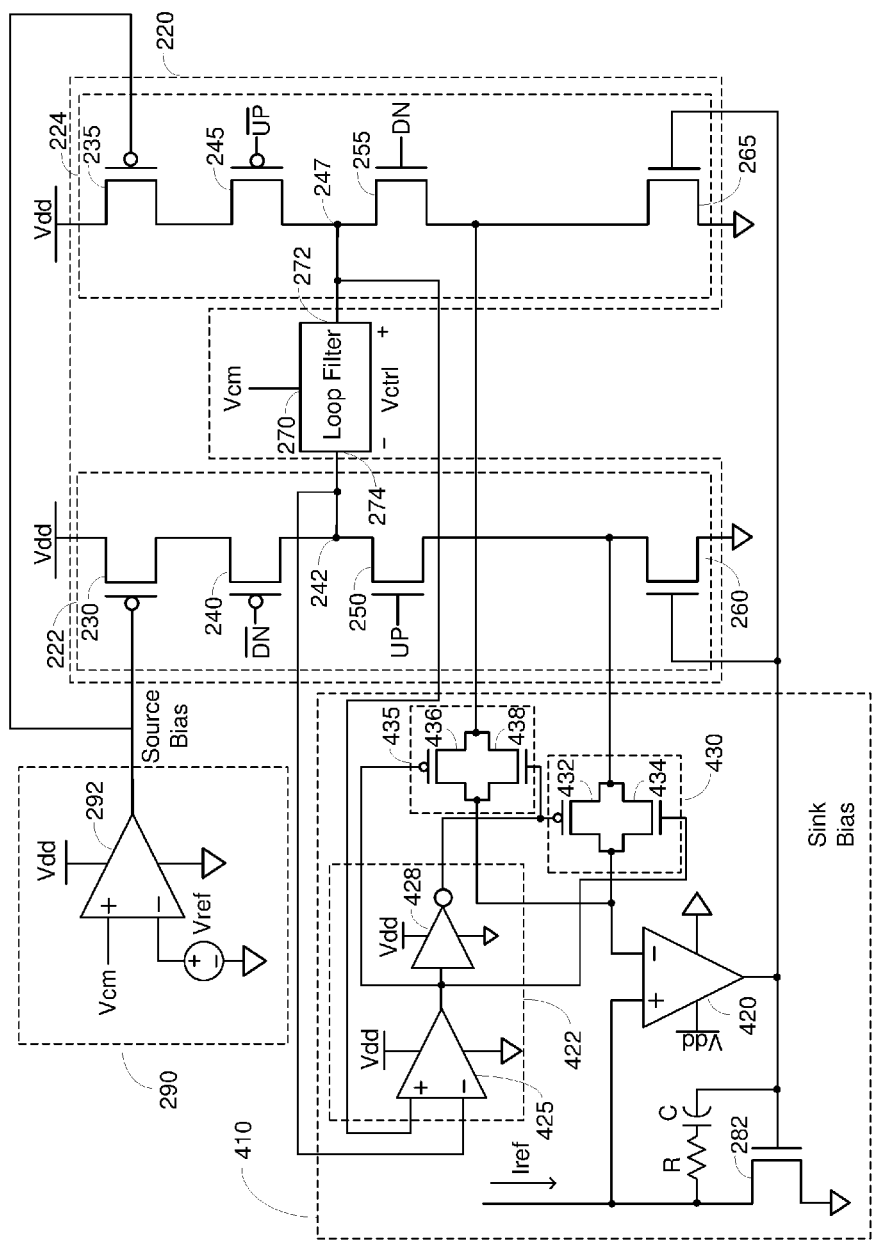
FIG. 4 shows an example of a differential charge pump with an extended output control voltage range according to certain aspects of the present disclosure.

In this regard, FIG. 4 shows an exemplary implementation of the feedback circuit 410 according to certain aspects. The feedback circuit 410 includes a second error amplifier 420, a first transmission gate 430, a second transmission gate 435, and a transmission-gate control circuit 422. The first transmission gate 430 is coupled between the drain of the first current sink transistor 260 and a first input of the error amplifier 420, and the second transmission gate 435 is coupled between the drain of the second current sink transistor 265 and the first input of the error amplifier 420.

The transmission-gate control circuit 422 senses the polarity of the control voltage Vctrl across the loop filter 270, and controls the first and second transmission gates 430 and 435 based on the sensed polarity. More particularly, the transmission-gate control circuit 422 turns on the first transmission gate 430 if the polarity of the control voltage Vctrl is positive (i.e., voltage at terminal 272 is greater than the voltage at terminal 274). Thus, the first transmission gate 430 couples the drain of the first current sink transistor 260 to the first input of the error amplifier 420 when the polarity of the control voltage Vctrl is positive. In this case, the drain-to-source voltage of the first sink transistor 260 is lower than the drain-to-source voltage of the second sink transistor 265. If the magnitude of the control voltage Vctrl is large, then the drain-to-source voltage of the first sink transistor 260 may be low (compressed), pushing the first sink transistor 260 into the triode region.

The transmission-gate control circuit 422 turns on the second transmission gate 435 if the polarity of the control voltage Vctrl is negative (i.e., voltage at terminal 274 is greater than the voltage at terminal 272). Thus, the second transmission gate 435 couples the drain of the second current sink transistor 265 to the first input of the error amplifier 420 when the polarity of the control voltage Vctrl is negative. In this case, the drain-to-source voltage of the second sink transistor 265 is lower than the drain-to-source voltage of the first sink transistor 260. If the magnitude of the control voltage Vctrl is large, then the drain-to-source voltage of the second sink transistor 265 may be low (compressed), pushing the second sink transistor 265 into the triode region.

Thus, the first input of the error amplifier 420 is coupled to the drain of the sink transistor with the lower drain-to-source voltage, and therefore, the sink transistor that is pushed into the triode region when the magnitude of the control voltage Vctrl is large (e.g., close to rail-to-rail).

A second input of the error amplifier 420 is coupled to the drain of the current reference transistor 282, as shown in FIG. 4. The output of the error amplifier 420 is coupled to the gates of the current reference transistor 282, the first sink transistor 260, and the second sink transistor 265. Thus, the output of the error amplifier 420 provides the gate bias voltage (denoted "Sink Bias") for the current reference transistor 282, the first sink transistor 260, and the second sink transistor 265.

In operation, the error amplifier 420 compares the drain voltage of the current reference transistor 282 with the drain voltage of the sink transistor 260 or 265 that is currently coupled to the error amplifier 420 (i.e., the sink transistor 260 or 265 with the lower drain-to-source voltage). The error amplifier 420 then adjusts the gate bias voltage of the sink transistors 260 and 265 and the current reference transistor 282 in a direction that reduces the difference (error) between the drain voltage (potential) of the current reference transistor 282 and the drain voltage (potential) of the sink transistor 260 or 265 currently coupled to the error amplifier 420. This feedback causes the sink current of the charge pump 220 to more precisely match the reference current Iref, even when one of the sink transistors 260 and 265 is pushed into the triode region.

As shown in FIG. 4, the common-mode feedback circuit 290 is still used to control the gate bias voltage (denoted "Source Bias") of the first and second source transistors 230 and 235 so that the source current has approximately the same magnitude as the sink current. Thus, the system in FIG. 4 has two feedback loops. More particularly, the system has a first feedback loop associated with the feedback circuit 410 to establish an approximately constant sink current magnitude over an extended voltage control Vctrl range, and a second feedback loop associated with the common-mode feedback circuit 290 to set the source current approximately equal to the sink current in magnitude.

To maintain stability of the system, the first feedback loop associated with the feedback circuit 410 is made into a dominant feedback loop of the system, and the second feedback loop associated with the common-mode feedback circuit 290 is made into a non-dominant feedback loop of the system. In general, the first feedback loop (dominant feedback loop) is characterized by higher gain and wider bandwidth than the second feedback loop (non-dominant feedback loop). The first feedback loop may be made into the dominant loop by making the gain of the second error amplifier 420 in the feedback circuit 410 higher than the gain of the first error amplifier 292 in the common-mode feedback circuit 290. For example, the second error amplifier 420 may include a larger number of amplifying (gain) stages than the first error amplifier 292 so that the second error amplifier 420 has a higher gain.

Figure 5:
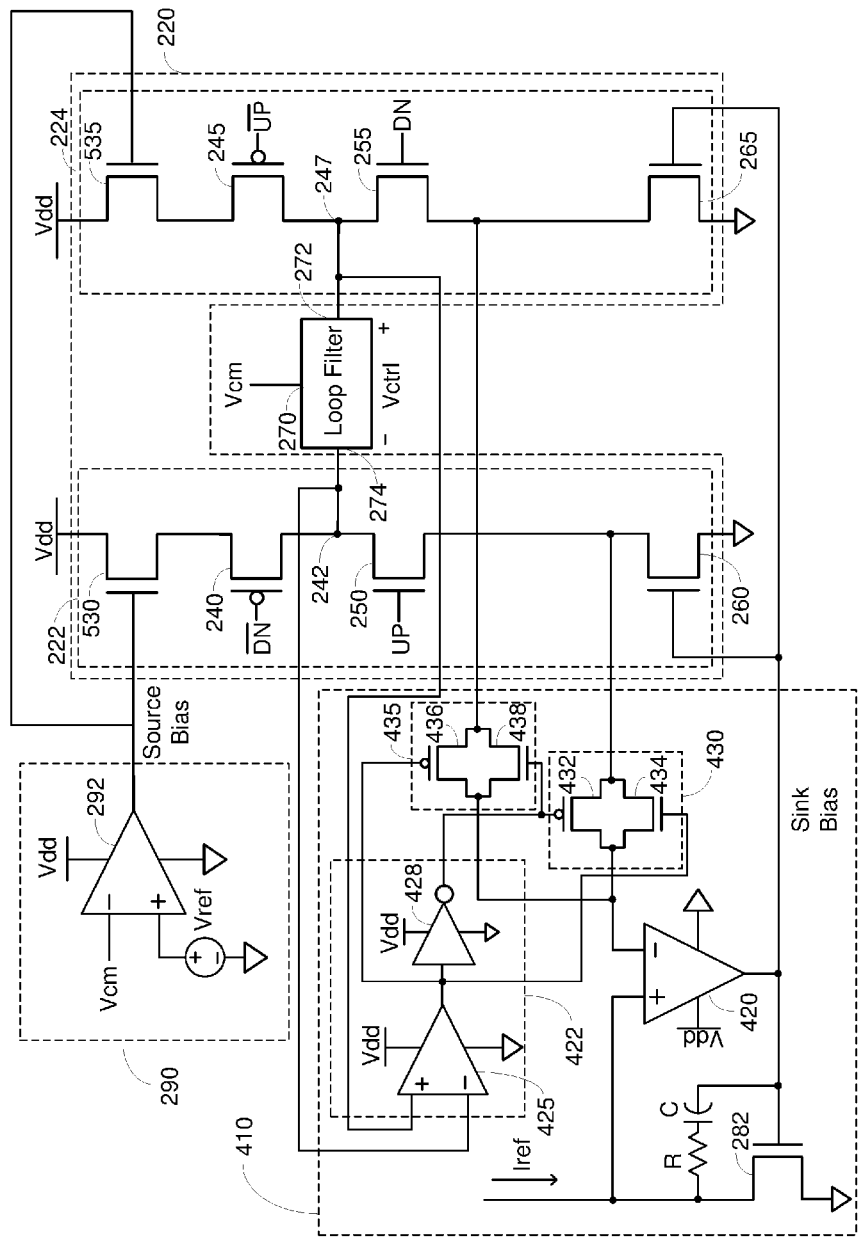
FIG. 5 shows another example of a differential charge pump with an extended output control voltage range according to certain aspects of the present disclosure.

In certain aspects, the first and second source transistors 230 and 235 may be implemented with NFETs instead of PFETs to intentionally reduce the gain of the second feedback loop, and therefore help ensure that the second feedback loop is the non-dominant loop. In this regard, FIG. 5 shows an example in which the first and second source transistors 530 and 535 are implemented with NFETs instead of the PFETs shown in FIG. 4. In this example, the first and second source transistors 530 and 535 are connected in a source-follower configuration (also referred to as a common-drain configuration), in which the drains of the first and second source transistors 530 and 535 are coupled to the supply rail Vdd, and the sources of the first and second source transistors 530 and 535 are coupled to switch transistors 240 and 245, respectively. In contrast, the first and second transistors 230 and 235 in FIG. 4 (which are implemented with PFETs) are connected in a common-source configuration, in which the sources of the first and second source transistors 230 and 235 are coupled to the supply rail Vdd, and the drains of the first and second source transistors 230 and 235 are coupled to switch transistors 240 and 245, respectively. The source-follower configuration has lower gain than the common-source configuration. Therefore, implementing the first and second source transistors 530 and 535 with NFETs instead of PFETs reduces the gain of the source transistors, and hence the gain of the second feedback loop. Thus, the first and second source transistors may be implemented with NFETs to intentionally reduce the gain of the second feedback loop to help ensure that the second feedback loop is the non-dominant loop of the system.

In the example shown in FIGS. 4 and 5, the transmission-gate control circuit 422 includes a comparator 425 having a first input coupled to terminal 272 of the loop filter 270, a second input coupled to terminal 274 of the loop filter 270, and an output. In operation, the comparator 425 senses the polarity of the control voltage Vctrl across the loop filter 270 by comparing the voltages at terminals 272 and 274 of the loop filter 270. The output of the comparator 425 is high (e.g., approximately Vdd) if the polarity of the control voltage Vctrl is positive, and low (e.g., approximately ground) if the polarity of the control voltage Vctrl is negative. The inverter 428 has an input coupled to the output of the comparator 425, and an output. The inverter 428 generates the inverse of the output signal of the comparator 425.

In this example, the first transmission gate 430 includes a PFET 432 and an NFET 434 coupled in parallel between the drain of the first current sink transistor 260 and the first input of the error amplifier 420. The gate of the NFET 434 is coupled to the output of the comparator 425 and the gate of the PFET 432 is coupled to the output of the inverter 428. In operation, both the NFET 434 and the PFET 432 turn on when the output of the comparator 425 is high (i.e., polarity of Vctrl is positive), and therefore couple the drain of the first current sink transistor 260 to the first input of the error amplifier 420. In this case, the second transmission gate 435 is turned off.

In this example, the second transmission gate 435 includes a PFET 436 and an NFET 438 coupled in parallel between the drain of the second current sink transistor 265 and the first input of the error amplifier 420. The gate of the NFET 438 is coupled to the output of the inverter 428 and the gate of the PFET 436 is coupled to the output of the comparator 425. In operation, both the NFET 438 and the PFET 436 turn on when the output of the comparator 425 is low (i.e., polarity of Vctrl is negative), and therefore couple the drain of the second current sink transistor 265 to the first input of the error amplifier 420. In this case, the first transmission gate 430 is turned off.

In certain aspects, the feedback circuit 410 also includes a resistor R and capacitor C coupled in series between the drain and gate of the current reference transistor 282, as shown in FIGS. 4 and 5. The resistor R and capacitor C form an RC compensation network for setting a dominate pole of the first feedback loop. In this regard, the resistance and capacitance of R and C may be chosen to set the dominate pole at a frequency corresponding to a desired bandwidth for the first feedback loop.

Figure 6:
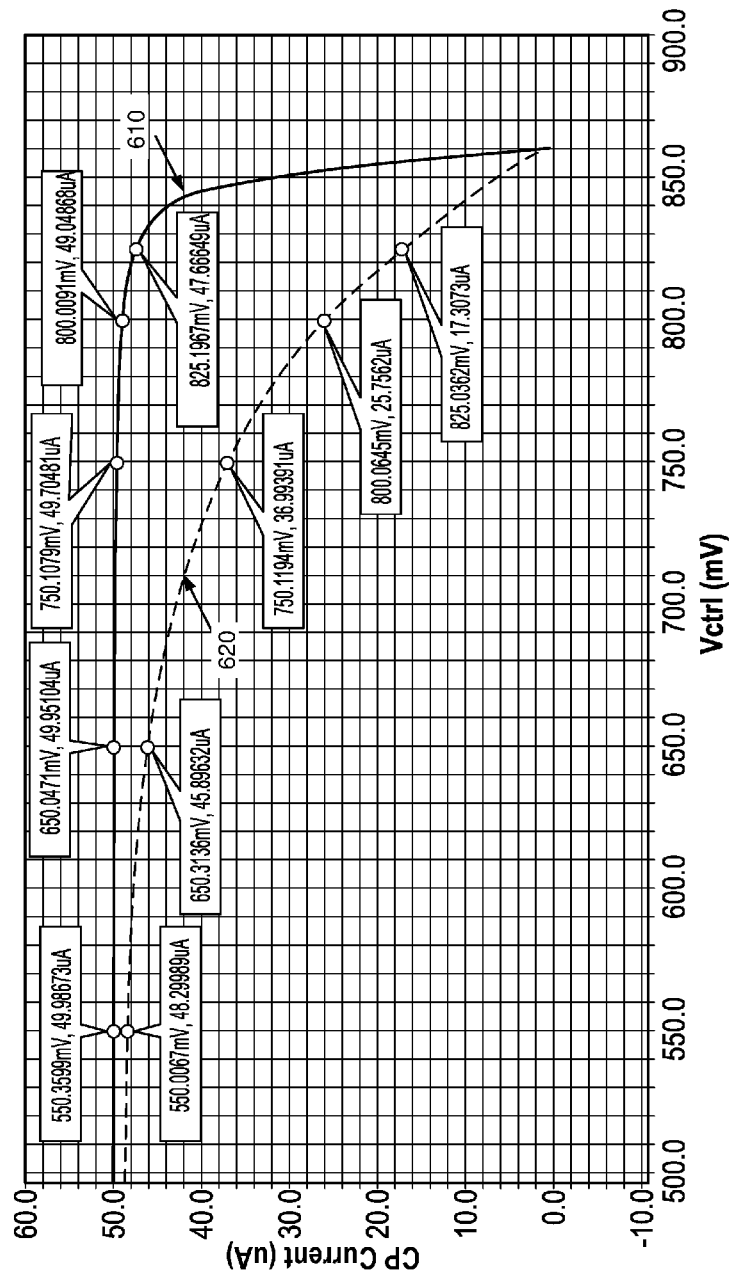
FIG. 6 is a plot showing an example of sink current with a feedback loop and an example of sink current without the feedback loop according to certain aspects of the present disclosure.

As discussed above, the first feedback loop allows the charge pump 220 to maintain an approximately constant current magnitude over a larger (extended) control voltage Vctrl range. In this regard, FIG. 6 is a plot showing an example of the sink current 610 of the charge pump 220 with the first feedback loop as a function of the control voltage Vctrl. FIG. 6 also shows an example of the sink current 620 of the charge pump 220 without the first feedback loop as a function of the control voltage Vctrl. In the example in FIG. 6, the reference current is approximately 50 µA. The current mirror 280 shown in FIG. 2 is used to set the current level for the sink current 620 without the first feedback loop.

As shown in FIG. 6, the first feedback loop is able to maintain the sink current 610 close to 50 µA over an extended voltage control Vctrl range. In contrast, the sink current 620 without the first feedback loop begins to drop significantly when the control voltage is increased past 650 mV. For example, the sink current 610 with the first feedback loop only drops to approximately 47.67 µA at a relatively large control voltage Vctrl of approximately 825 mV. In contrast, the sink current 620 without the first feedback loop drops down to approximately 17.3 µA at about the same control voltage Vctrl.

Thus, the first feedback loop is able to maintain the sink current 610 at an approximately constant current level (e.g., within 10% of the reference current) over an extended control voltage Vctrl range. The extended control voltage Vctrl range advantageously increases the tunable frequency range of the VCO 150.

Figure 7:
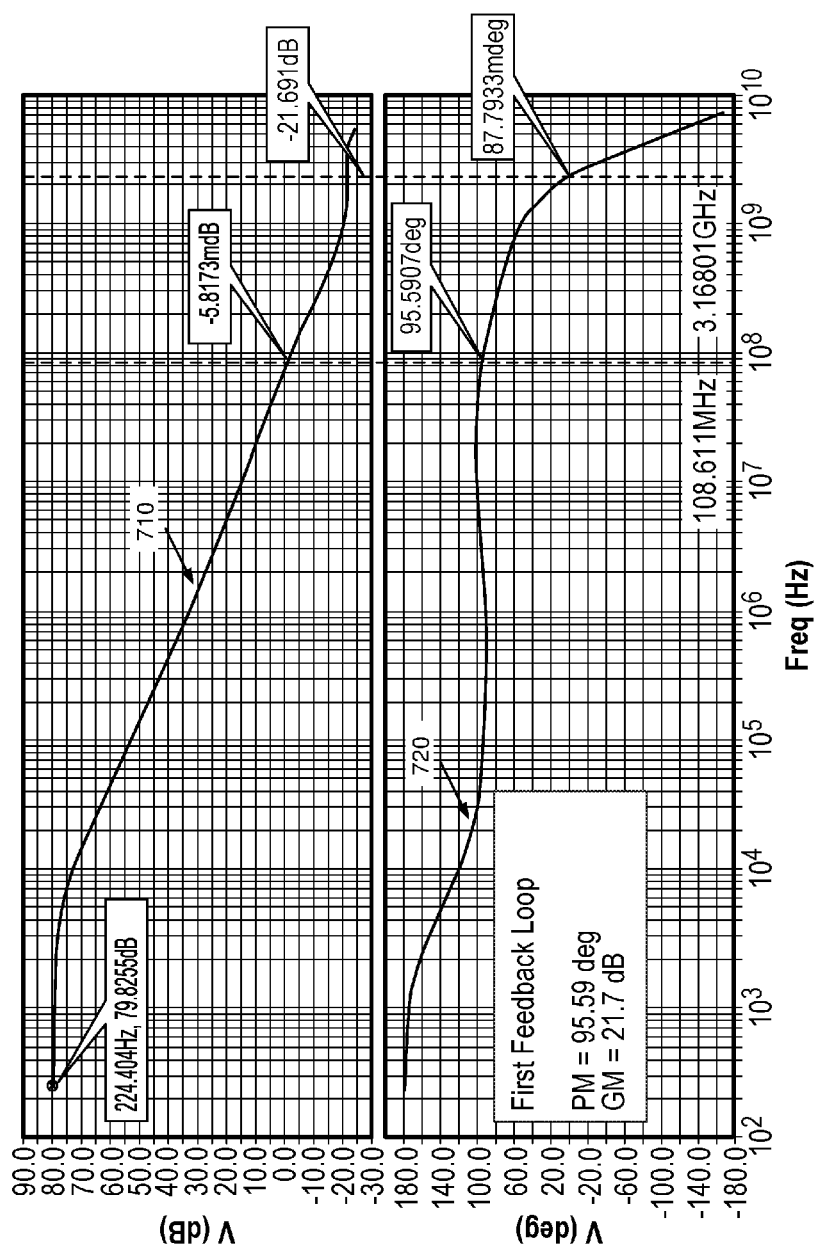
FIG. 7 is a plot showing an example of open loop gain as a function of frequency for a first feedback loop according to certain aspects of the present disclosure.

As discussed above, the first feedback loop (dominate feedback loop) is generally characterized by higher gain and wider bandwidth than the second feedback loop (non-dominant feedback loop). In this regard, FIG. 7 is a plot showing an example of the open loop gain 710 for the first feedback loop as a function of frequency. In this example, the open loop gain is approximately 79.82 dB at low frequencies, and the unity gain bandwidth (i.e., frequency at which the gain drops to 0 dB) is approximately 108.61 MHz. FIG. 7 also shows the phase margin 720 for the first feedback loop as a function of frequency. As shown in FIG. 7, the phase margin is approximately 95.59 degrees at unity gain, indicating that the first feedback loop is stable. Generally, a positive phase margin is desired at unity gain to maintain loop stability.

Figure 8:
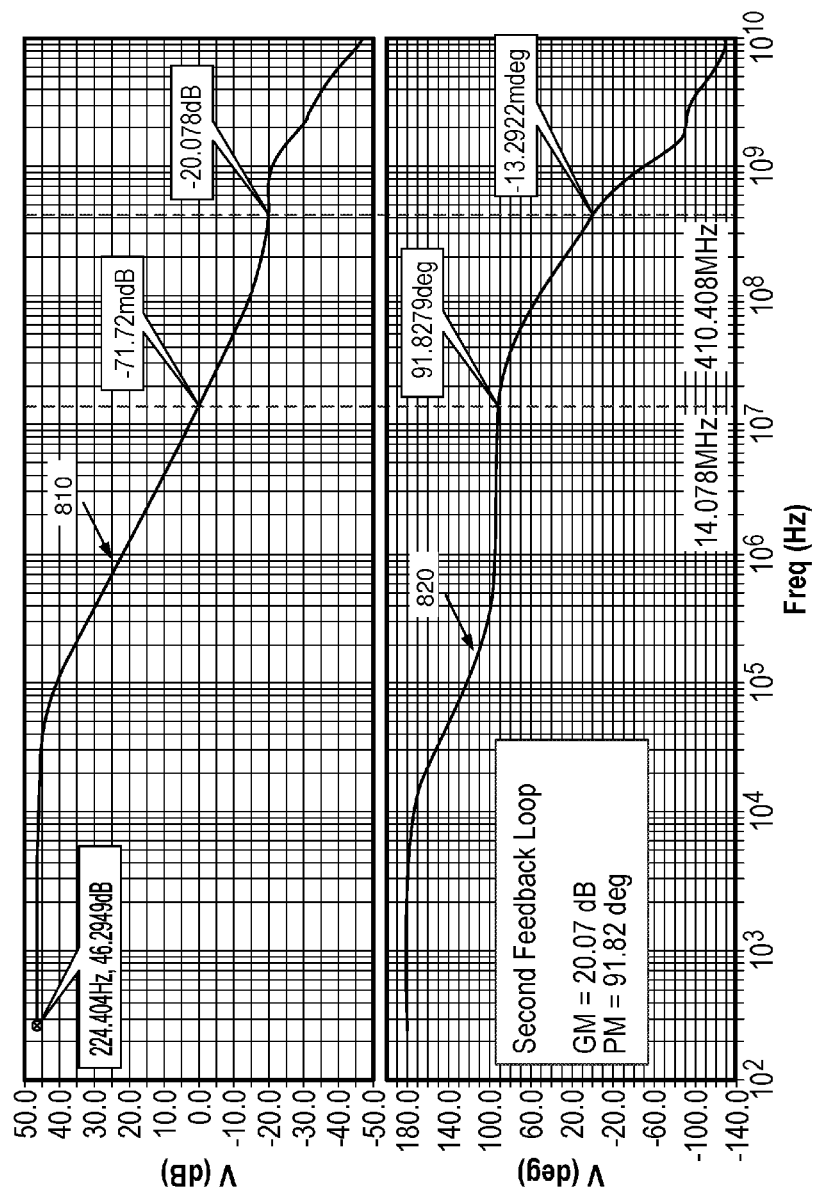
FIG. 8 is a plot showing an example of open loop gain as a function of frequency for a second feedback loop according to certain aspects of the present disclosure.

FIG. 8 is a plot illustrating an example of the open loop gain 810 for the second feedback loop as a function of frequency. In this example, the open loop gain is approximately 46.29 dB at low frequencies, and the unity gain bandwidth is approximately 14.07 MHz. Thus, in this example, the second feedback loop has a lower open loop gain and smaller unity gain bandwidth than the first feedback loop shown in FIG. 7, making the first feedback loop the dominate feedback loop of the system, as discussed above. If the gain curve 710 for the first the feedback loop and the gain curve 810 for the second feedback loop were superimposed on the same plot (not shown), then the gain curve 710 for the first feedback loop (dominate feedback loop) would stay above the gain curve 810 for the second feedback loop (non-dominate feedback loop) over the entire frequency range (i.e., the gain curves would not cross). In other words, the gain for the first feedback loop stays above the gain for the second feedback loop over the entire frequency range. This may be accomplished, for example, by making the gain of the error amplifier 420 in the feedback circuit 410 higher than the gain of the error amplifier 292 in the common-mode feedback circuit 290, implementing the source transistors 530 and 535 in the second feedback loop with NFETs to reduce the gain of the second feedback loop, and/or other techniques.

FIG. 8 also shows the phase margin 820 for the second feedback loop as a function of frequency. As shown in FIG. 8, the phase margin is approximately 91.83 degrees at unity gain, indicating that the second feedback loop is stable.

Figure 9:
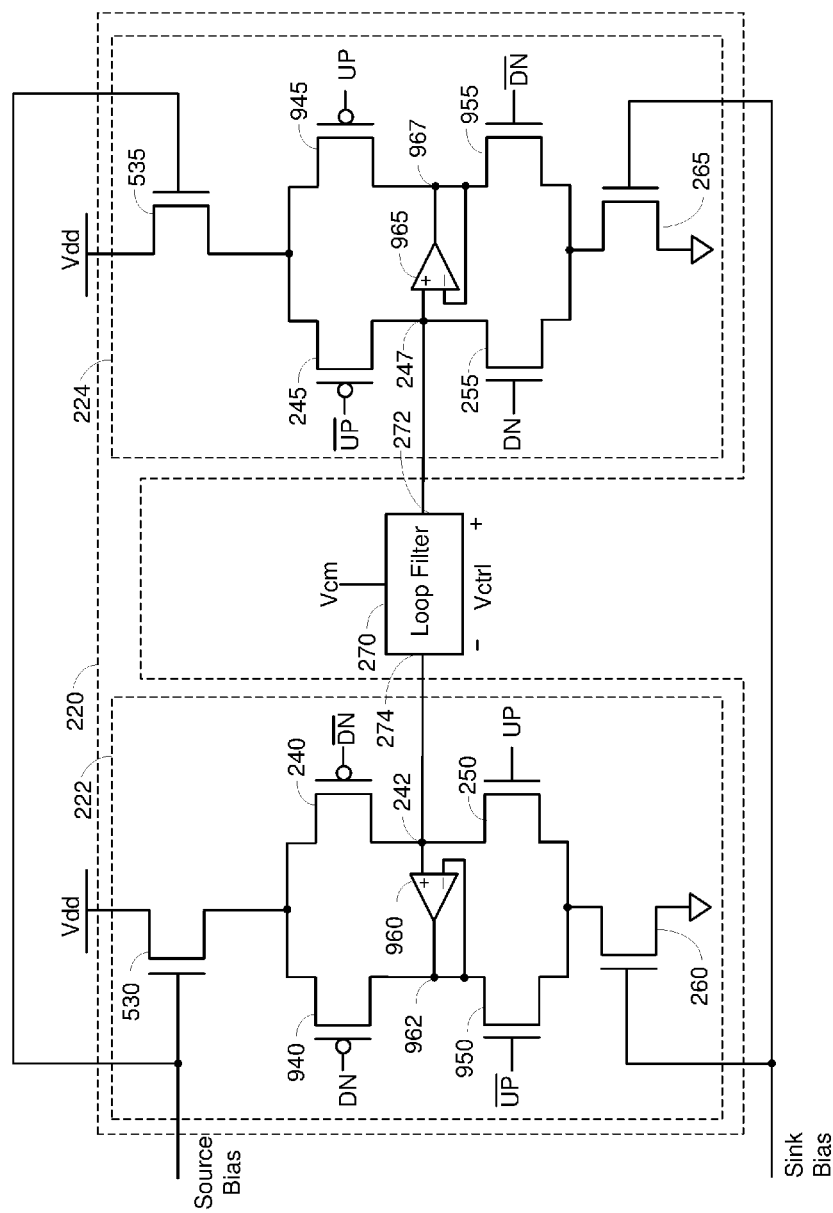
FIG. 9 shows still another example of a differential charge pump with an extended output control voltage range according to certain aspects of the present disclosure.

FIG. 9 shows an example of the charge pump 220, in which the first branch 222 further includes a fifth switch transistor 940, a sixth switch transistor 950, and a first sense amplifier 960, and the second branch 224 further includes a seventh switch transistor 945, an eighth switch transistor 955, and a second sense amplifier 965.

In this example, the fifth switch transistor 940 (e.g., PFET) is coupled between the source of the first current source transistor 530 and node 962, and the sixth switch transistor 950 (e.g., NFET) is coupled between node 962 and the drain of the first current sink transistor 260. The first sense amplifier 960 has a first input coupled to output node 242, a second input coupled to node 962, and an output coupled to node 962. The first sense amplifier 960 is connected in a unity gain configuration to force the voltage at node 962 to be approximately equal to the voltage at output node 242 (i.e., voltage at terminal 274 of the loop filter 270). The gate of the fifth switch transistor 940 is configured to receive a DN signal from the PDF 115. Since the fifth switch transistor 940 is implemented with a PFET in this example, the fifth switch transistor 940 turns off when a DN signal is received, and turns on otherwise. The gate of the sixth switch transistor 950 is configured to receive an inverse of an UP signal. Since the sixth switch transistor 950 is implemented with an NFET in this example, the sixth switch transistor 950 turns off when an UP signal is received, and turns on otherwise.

The seventh switch transistor 945 (e.g., PFET) is coupled between the source of the second current source transistor 535 and node 967, and the eighth switch transistor 955 (e.g., NFET) is coupled between node 967 and the drain of the second current sink transistor 265. The second sense amplifier 965 has a first input coupled to output node 247, a second input coupled to node 967, and an output coupled to node 967. The second sense amplifier 965 is connected in a unity gain configuration to force the voltage at node 967 to be approximately equal to the voltage at output node 247 (i.e., voltage at terminal 272 of the loop filter 270). The gate of the seventh switch transistor 945 is configured to receive an UP signal from the PDF 115. Since the seventh switch transistor 950 is implemented with a PI-BT in this example, the seventh switch transistor 950 turns off when an UP signal is received, and turns on otherwise. The gate of the eighth switch transistor 955 is configured to receive an inverse of a DN signal. Since the eighth switch transistor 955 is implemented with an NFET in this example, the eighth switch transistor 955 turns off when a DN signal is received, and turns on otherwise.

Figure 3A:
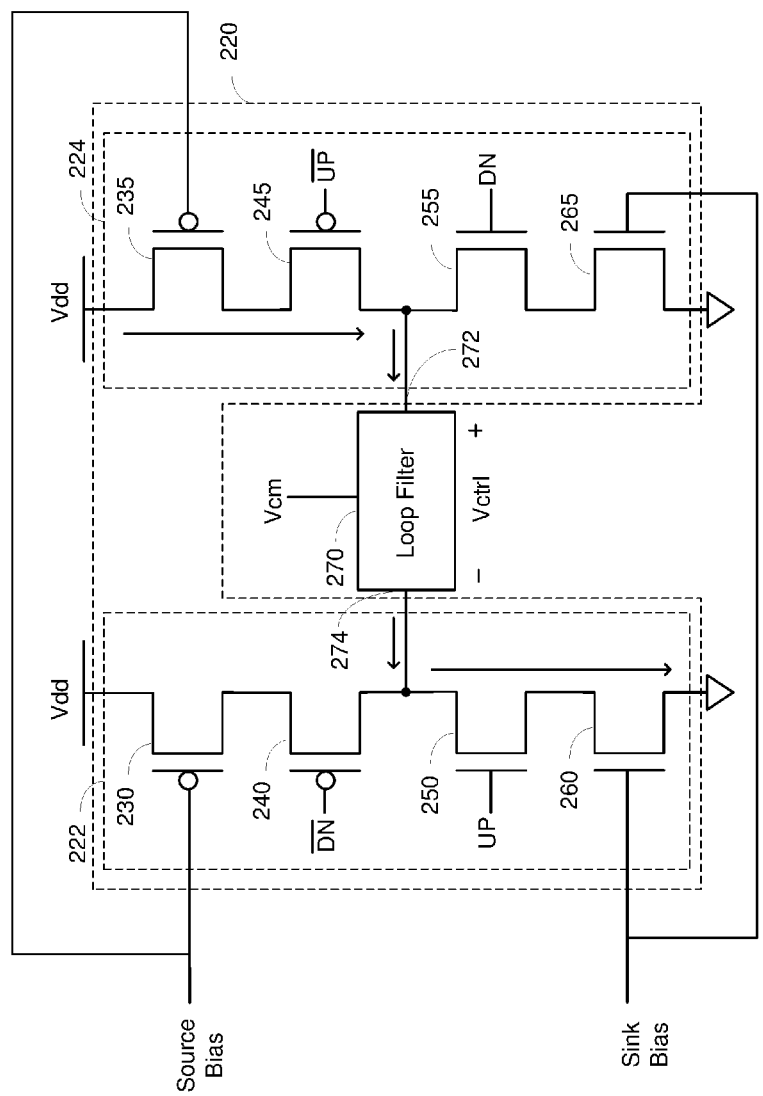
FIG. 3A shows a conduction path in the differential charge pump when an up signal is input to the charge pump according to certain aspects of the present disclosure.

In operation, when the charge pump 220 receives an UP signal, the second and third switch transistors 250 and 245 turn on, resulting in the conduction path shown in FIG. 3A discussed above. In this case, the second current source transistor 535 sources current to terminal 272 of the loop filter 270, and the first sink transistor 260 draws (sinks) current from terminal 274 of the loop filter 270.

In addition, the fifth switch transistor 940 and the eighth switch transistor 955 are both turned on and the sixth switch transistor 950 and the seventh switch transistor 945 are both turned off. The fifth switch transistor 940 couples the source of the first source transistor 530 to node 962, and hence the output of the first sense amplifier 960. The output of the first sense amplifier 960 sinks current from the first source transistor 530 and keeps the voltage at the source of the first source transistor 530 approximately equal to the voltage at output node 242 (and hence the voltage at terminal 274 of the loop filter 270). This prevents a capacitor at the source of the first source transistor 530 from being charged during the time that the first source transistor 530 is not being used to source current to the loop filter 270, which can cause undesirable charge sharing when the first source transistor 530 is later coupled to the loop filer 270.

The eighth switch transistor 955 couples the drain of the second sink transistor 265 to node 967, and hence the output of the second sense amplifier 965. The output of the second sense amplifier 965 sources current to the second sink transistor 265 and keeps the voltage at the drain of the second sink transistor 265 approximately equal to the voltage at output node 247 (and hence the voltage at terminal 272 of the loop filter 270). This prevents a capacitor at the drain of the second sink transistor 265 from being discharged during the time that the second sink transistor 265 is not being used to sink current from the loop filter 270, which can cause undesirable charge sharing when the second sink transistor 265 is later coupled to the loop filer 270.

Figure 3B:
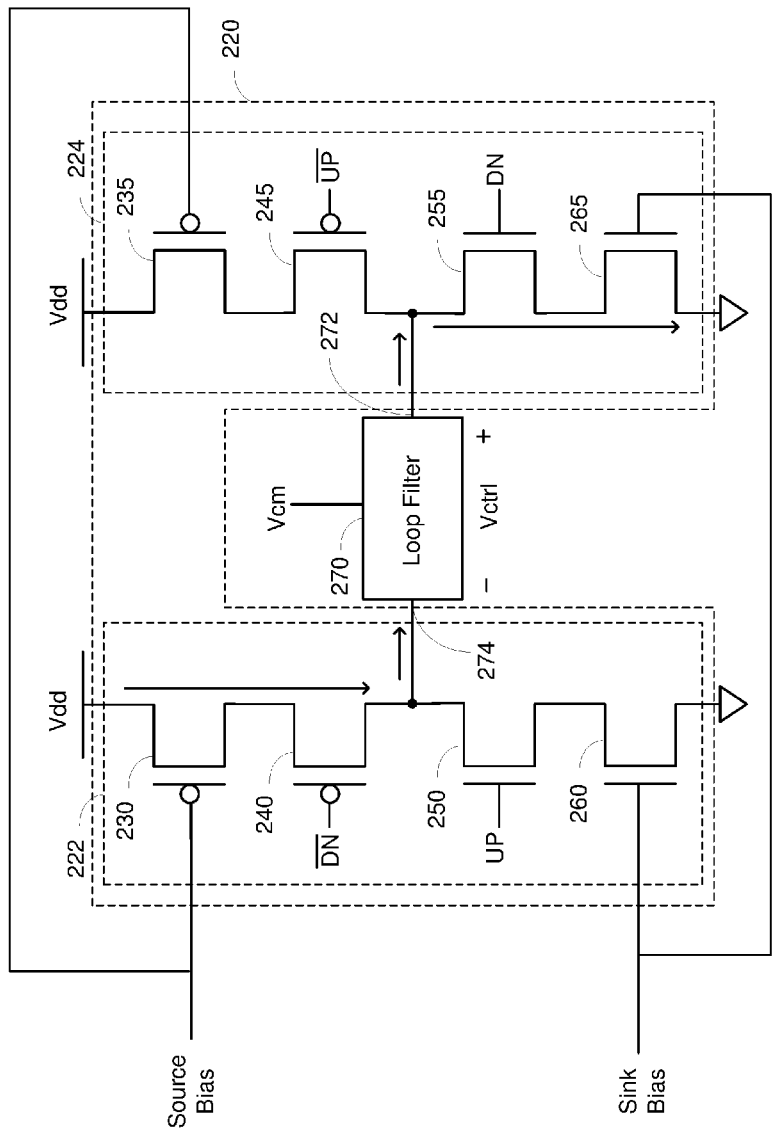
FIG. 3B shows a conduction path in the differential charge pump when a down signal is input to the charge pump according to certain aspects of the present disclosure.

When the charge pump 220 receives a DN signal, the first and fourth switch transistors 240 and 255 turn on, resulting in the conduction path shown in FIG. 3B discussed above. In this case, the first current source transistor 530 sources current to terminal 274 of the loop filter 270, and the second sink transistor 265 draws (sinks) current from terminal 272 of the loop filter 270.

In addition, the sixth switch transistor 950 and the seventh switch transistor 945 are both turned on and the fifth transistor switch 940 and the eighth switch transistor 955 are both turned off. The sixth switch transistor 950 couples the drain of the first sink transistor 260 to node 962, and hence the output of the first sense amplifier 960. The output of the first sense amplifier 960 sources current to the first sink transistor 260 and keeps the voltage at the drain of the first sink transistor 260 approximately equal to the voltage at output node 242 (and hence the voltage at terminal 274 of the loop filter 270). This prevents a capacitor at the drain of the first sink transistor 260 from being discharged during the time that the first sink transistor 260 is not being used to sink current from the loop filter 270, which can cause undesirable charge sharing when the first sink transistor 260 is later coupled to the loop filer 270.

The seventh switch transistor 945 couples the source of the second source transistor 535 to node 967, and hence the output of the second sense amplifier 965. The output of the second sense amplifier 965 sinks current from the second source transistor 535 and keeps the voltage at the source of the second source transistor 535 approximately equal to the voltage at output node 247 (and hence the voltage at terminal 272 of the loop filter 270). This prevents a capacitor at the source of the second source transistor 535 from being charged during the time that the second source transistor 535 is not being used to source current to the loop filter 270, which can cause undesirable charge sharing when the second source transistor 535 is later coupled to the loop filer 270.

Figure 10:
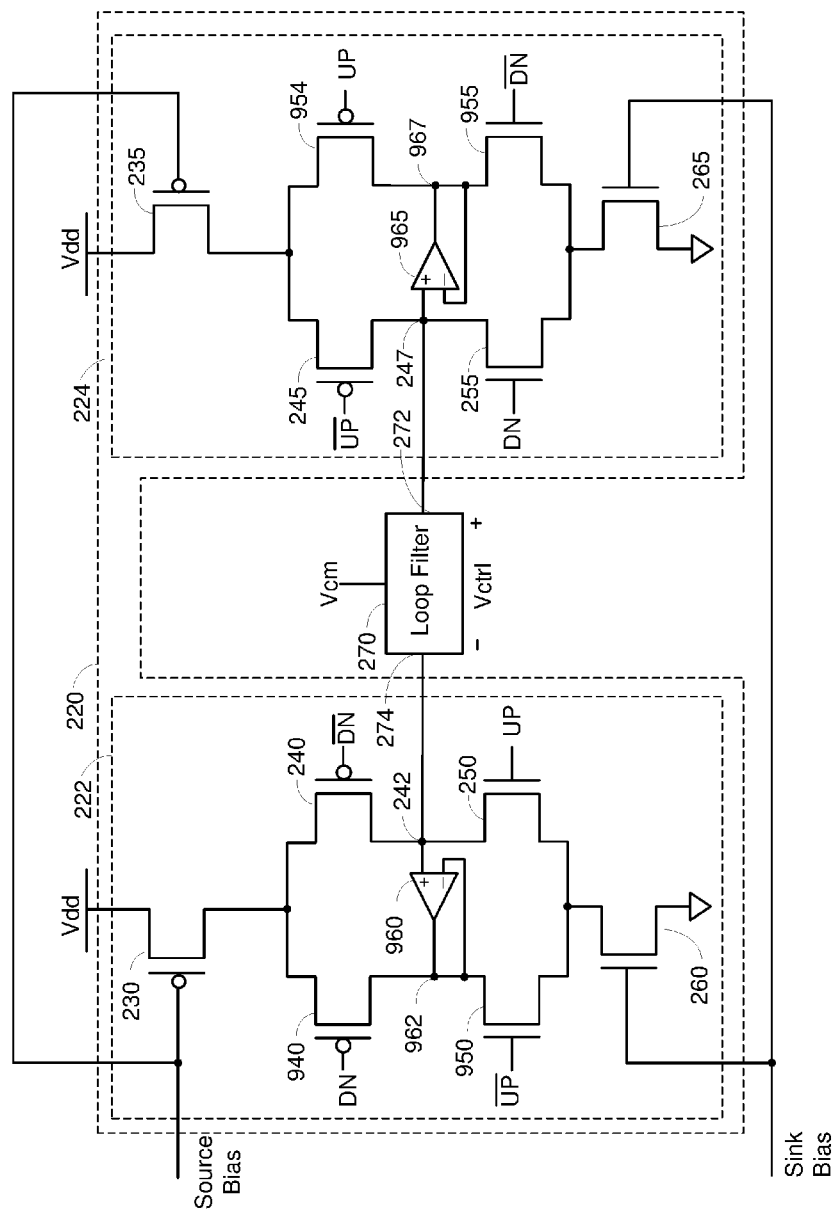
FIG. 10 shows an example in which current source transistors in the differential charge pump shown in FIG. 9 are implemented with PFETs according to certain aspects of the present disclosure.

In the example shown in FIG. 9, the first and second source transistors 530 and 535 are implemented with NFETs. However, it is to be appreciated that the present disclosure is not limited to this example, and that the first and second source transistors may instead be implemented with PFETs. In this regard, FIG. 10 shows an example, in which the first and second source transistors 230 and 235 are implemented with PFETs. In this example, the fifth switch transistor 940 is coupled between the drain of the first source transistor 230 and the output of the first sense amplifier 960, and the seventh switch transistor 945 is coupled between the drain of the second source transistor 235 and the output of the second sense amplifier 965.

Figure 11:
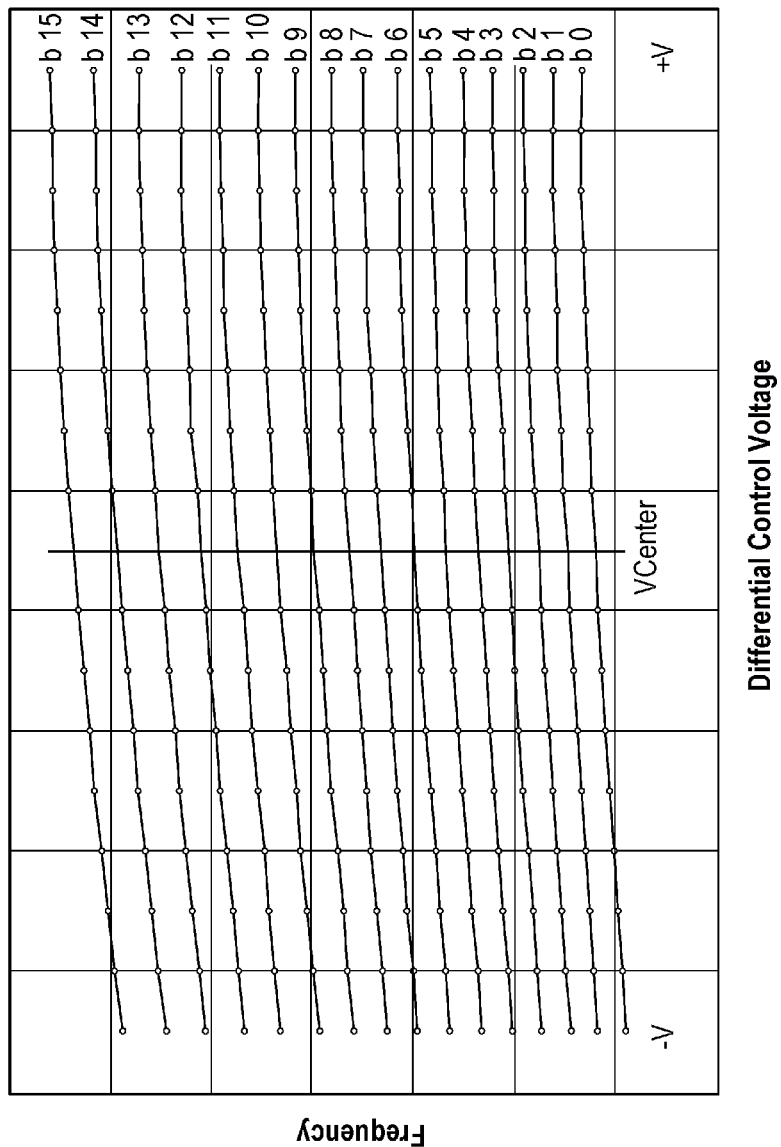
FIG. 11 shows an example of different frequency bands for a voltage-controlled oscillator according to certain aspects of the present disclosure.

In certain aspects, the VCO 150 may have multiple frequency bands, as example of which is shown in FIG. 11. In FIG. 11, the different frequency bands are labeled b0 to b15. In this example, the VCO 150 may include an inductor-capacitor (LC) tank having a tunable capacitance, in which the capacitance of the LC tank may be set to any one of multiple different discrete capacitances according to a digital control signal. Each of the frequency bands b0 to b15 corresponds to a different one of the capacitances. For each band, the frequency of the VCO 150 may be tuned within the band by adjusting the control voltage Vctrl. In FIG. 11, frequency is on the vertical axis and control voltage is on the horizontal axis. The center line (labeled "VCenter") in FIG. 11 indicates a control voltage of approximately zero volts, in which control voltages to the right of the center line have a positive polarity and control voltages to the left of the center line have a negative polarity. Note that the control voltage from the differential charge pump 220 is differential, and crosses the center line when the polarity of the control voltage changes.

As discussed above, the first feedback loop increases (extends) the control voltage Vctrl range of the charge pump 220. This increases the tunable frequency range for each of the bands b0 to b15 shown in FIG. 11 (i.e., makes each band wider in the frequency direction). Extending the tunable frequency range for each of the bands b0 to b15 helps ensure that the bands b0 to b15 overlap each other in frequency. Having the bands overlap each other in frequency allows the frequency of the VCO 150 to be tuned continuously over a wide frequency range. This is because, if there were any gaps between the bands in frequency, then the VCO 150 could not be tuned to frequencies located within the gaps.

Figure 12:
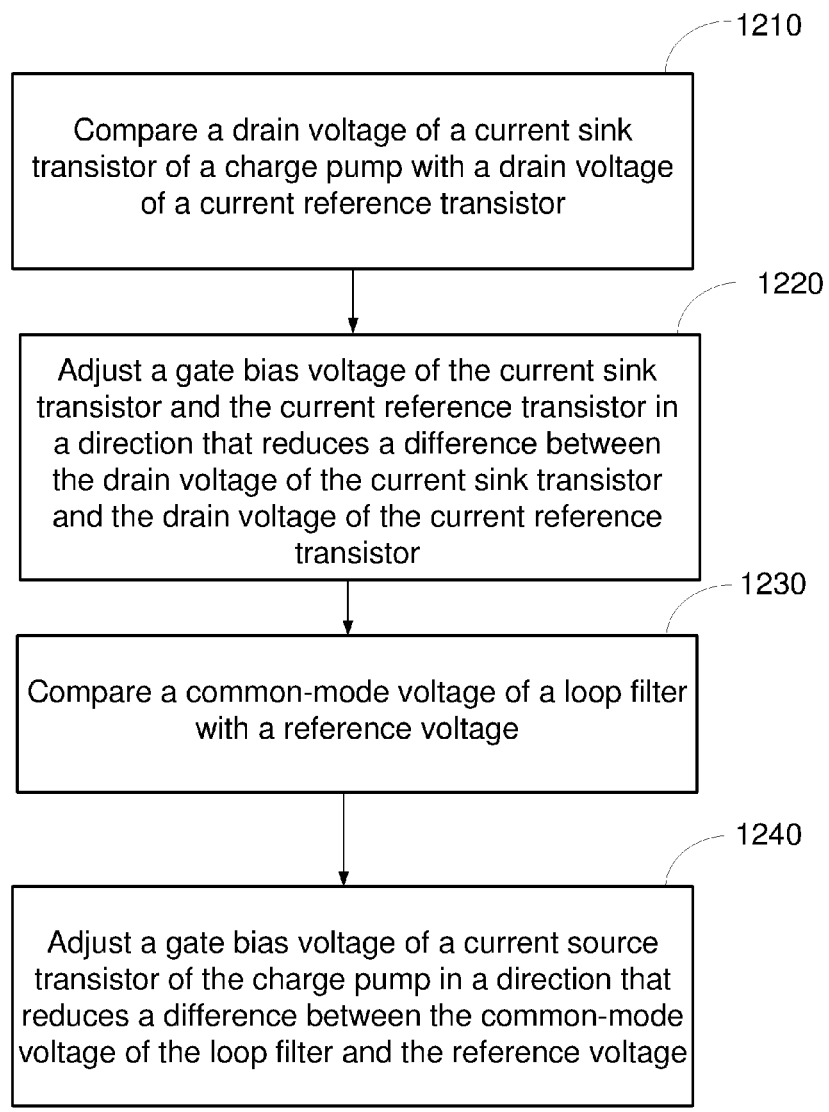
FIG. 12 is a flowchart illustrating a method for operating a charge pump according to certain aspects of the present disclosure.

FIG. 12 illustrates a method 1200 for operating a charge pump according to certain aspects of the present disclosure.

The method 1200 may be performed by the feedback circuit 410 and the common-mode feedback circuit 290.

At step 1210, a drain voltage of a current sink transistor of the charge pump is compared with a drain voltage of a current reference transistor. For example, the current reference transistor may correspond to current reference transistor 282, and the current sink transistor may correspond to current sink transistor 260 or 265. The current reference transistor may receive a reference current (e.g., Iref) used to set the current of the current sink transistor.

At step 1220, a gate bias voltage of the current sink transistor and the current reference transistor is adjusted in a direction that reduces a difference between the drain voltage of the current sink transistor and the drain voltage of the current reference transistor. This step may be performed, for example, by error amplifier 420.

At step 1230, a common-mode voltage of a loop filter is compared with a reference voltage. For example, the loop filter may correspond to loop filter 270.

At step 1240, a gate bias voltage of a current source transistor of the charge pump is adjusted in a direction that reduces a difference between the common-mode voltage of the loop filter and the reference voltage. For example, the current source transistor may correspond to current source transistor 230, 235, 530 or 535. This step may be performed, for example, by error amplifier 292.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. A system, comprising:
a first feedback circuit configured to compare a drain voltage of a current sink transistor of a charge pump with a drain voltage of a current reference transistor, and to adjust a gate bias voltage of the current sink transistor and the current reference transistor in a direction that reduces a difference between the drain voltage of the current sink transistor and the drain voltage of the current reference transistor; and
a second feedback circuit configured to compare a common-mode voltage of a loop filter with a reference voltage, and to adjust a gate bias voltage of a current source transistor of the charge pump in a direction that reduces a difference between the common-mode voltage of the loop filter and the reference voltage.

2. The system of claim 1, wherein a first feedback loop of the first feedback circuit has a higher gain and a wider bandwidth than a second feedback loop of the second feedback circuit.

3. The system of claim 1, wherein the first feedback circuit comprises a first error amplifier having a first input coupled to a drain of the current sink transistor, a second input coupled to a drain of the current reference transistor, and an output coupled to a gate of the current sink transistor and a gate of the current reference transistor.

4. The system of claim 3, wherein the second feedback circuit comprises a second error amplifier having a first input coupled to the common-mode voltage of the loop filter, a second input coupled to the reference voltage, and an output coupled to a gate of the current source transistor.

5. The system of claim 4, wherein the first error amplifier has a higher gain than the second error amplifier.

6. The system of claim 4, wherein the current source transistor comprises an n-type field effect transistor (NFET).

7. The system of claim 1, wherein the current source transistor sources current to a loop filter and the current sink transistor sinks current from the loop filter.

8. A system, comprising:
a first error amplifier having a first input, a second input coupled to a drain of a current reference transistor, and an output coupled to a gate of the current reference transistor, a gate of a first current sink transistor of a charge pump, and a gate of a second current sink transistor of the charge pump;
a first transmission gate coupled between a drain of the first current sink transistor and the first input of the first error amplifier;
a second transmission gate coupled between a drain of the second current sink transistor and the first input of the first error amplifier; and
a control circuit configured to sense a polarity of a voltage across a loop filter, to turn on the first transmission gate if the sensed polarity of the voltage is positive, and to turn on the second transmission gate if the sensed polarity of the voltage is negative.

9. The system of claim 8, wherein the first current sink transistor sinks current from a first terminal of the loop filter when the charge pump receives an up signal, and the second current sink transistor sinks current from a second terminal of the loop filter when the charge pump receives a down signal.

10. The system of claim 8, further comprising a common-mode feedback circuit configured to compare a common-mode voltage of the loop filter with a reference voltage, and to adjust a gate bias voltage of a first current source transistor and a second current source transistor of the charge pump in a direction that reduces a difference between the common-mode voltage of the loop filter and the reference voltage.

11. The system of claim 10, wherein the common-mode feedback circuit comprises a second error amplifier having a first input coupled to the common-mode voltage of the loop filter, a second input coupled to the reference voltage, and an output coupled to a gate of the first current source transistor and a gate of the second current source transistor.

12. The system of claim 11, wherein the first error amplifier has a higher gain than the second error amplifier.

13. The system of claim 10, wherein the first current source transistor sources current to a first terminal of the loop filter when the charge pump receives an up signal, and the second current source transistor sources current to a second terminal of the loop filter when the charge pump receives a down signal.

14. The system of claim 13, wherein the first current sink transistor sinks current from the second terminal of the loop filter when the charge pump receives the up signal, and the second current sink transistor sinks current from the first terminal of the loop filter when the charge pump receives the down signal.

15. The system of claim 10, wherein the first current source transistor comprises a first n-type field effect transistor (NFET) and the second current source transistor comprises a second NFET.

16. A method for operating a charge pump, comprising:
comparing a drain voltage of a current sink transistor of the charge pump with a drain voltage of a current reference transistor;

adjusting a gate bias voltage of the current sink transistor and the current reference transistor in a direction that reduces a difference between the drain voltage of the current sink transistor and the drain voltage of the current reference transistor;

comparing a common-mode voltage of a loop filter with a reference voltage; and adjusting a gate bias voltage of a current source transistor of the charge pump in a direction that reduces a difference between the common-mode voltage of the loop filter and the reference voltage.

17. The method of claim 16, wherein adjusting the gate bias voltage of the current sink transistor comprises adjusting the gate bias voltage of the current sink transistor using a first error amplifier.

18. The method of claim 17, wherein adjusting the gate bias voltage of the current source transistor comprises adjusting the gate bias voltage of the current source transistor using a second error amplifier.

19. The method of claim 18, wherein the first error amplifier has a higher gain than the second error amplifier.

20. The method of claim 16, wherein the current source transistor comprises an n-type field effect transistor (NFET).

* * * * *